United States Patent [19]

Sugawara et al.

[11] Patent Number: 4,562,412
[45] Date of Patent: Dec. 31, 1985

[54] OSCILLATOR SYNCHRONIZED TO A PULSE

[75] Inventors: Mitsutoshi Sugawara; Kazuo Tokuda; Tokio Sawataishi, all of Tokyo, Japan

[73] Assignee: NEC Corporation, Tokyo, Japan

[21] Appl. No.: 499,387

[22] Filed: May 31, 1983

[30] Foreign Application Priority Data

May 31, 1982 [JP] Japan .................. 57-92584

[51] Int. Cl.$^4$ .................. H03B 5/00; H03B 5/36
[52] U.S. Cl. .................. 331/53; 331/116 R; 331/117 R; 331/173
[58] Field of Search .................. 331/116 R, 117 R, 172, 331/173, 53

[56] References Cited

U.S. PATENT DOCUMENTS 2,425,165  8/1947  Usselman .................. 331/173
3,278,862 10/1966  Danzer .................. 331/173
3,296,537  1/1967  Korpel .................. 331/173

OTHER PUBLICATIONS

Moorhouse, B., "Direct Synchronization of a Sinewave Oscillator to a Pulse", *Proc. IEE,* vol. 113, No. 11, Nov. '66.

*Primary Examiner*—Eugene R. LaRoche
*Assistant Examiner*—D. C. Mis
*Attorney, Agent, or Firm*—Laff, Whitesel, Conte & Saret

[57] ABSTRACT

An oscillation circuit has a free-running oscillator operating at a predetermined frequency. A signal generator generates a trigger signal in synchronism with an input signal. The trigger signal is supplied to the free-running oscillator to bring the signal level in the oscillator to a reference level. The oscillator keeps its frequency even when there is no input signal, the frequency being approximately equal to an integer multiplied by the frequency of the input signal.

9 Claims, 13 Drawing Figures

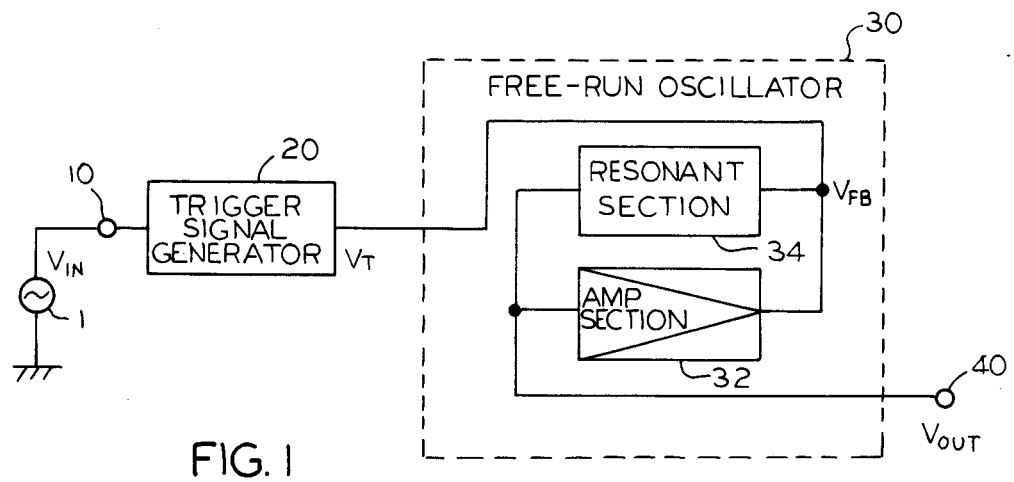
FIG. 1
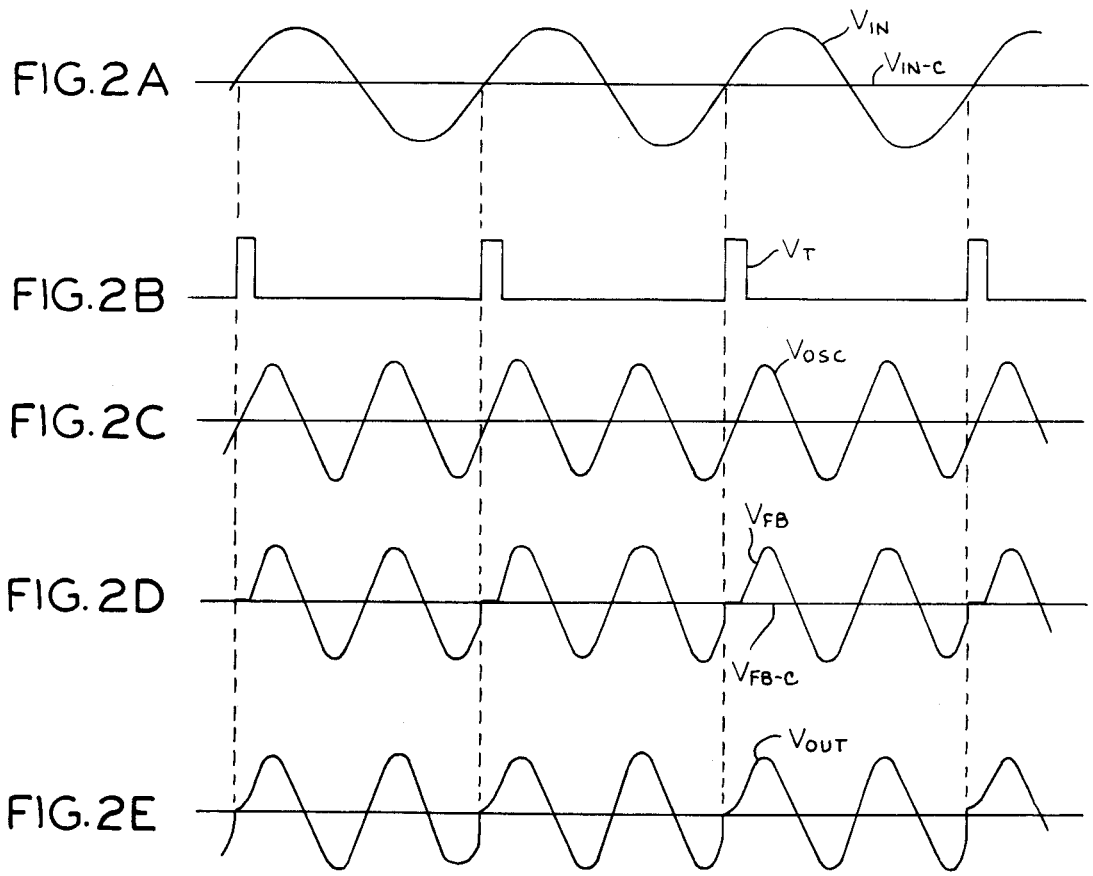
FIG. 2A
FIG. 2B
FIG. 2C
FIG. 2D
FIG. 2E

OSCILLATOR SYNCHRONIZED TO A PULSE

BACKGROUND OF THE INVENTION

This invention relates to an oscillator circuit. More particularly, the present invention relates to an oscillator circuit which generates an oscillation output signal having a frequency of n times (n being two or more integer) an input signal frequency.

A frequency-multiplication circuit using a tuning circuit and an oscillator circuit utilizing the phase lock loop (hereinafter referred to as "PLL") technique have been known as a circuit for obtaining a signal having a frequency which is an integer times as high as the frequency of an input signal.

The multiplication circuit using a tuning circuit is such that an input signal waveform is distorted to generate secondary, tertiary and higher harmonic signal components. One of the components is picked up by the tuning circuit. The multiplication circuit is advantageous in that the circuit arrangement is relatively simple. However, the multiplication circuit is not free from the problems that the voltage level of an output signal is changed and the phase relationship between the input and output signals can not be designed accurately. There is another disadvantage when the input signal is interrupted, because the output signal is no longer generated.

The oscillator circuit utilizing the PLL technique comprises a free-running oscillator of a voltage control type, a frequency divider, a phase comparator and a low pass filter. The frequency divider frequency-divides the oscillation signal of the free-run oscillator. The phase of a signal from the divider is compared with the phase of an input signal by the phase comparator, to generate a signal corresponding to the phase error. This signal is applied to the free-running oscillator through the low pass filter. Responsive thereto, the oscillation frequency of the free-running oscillator is controlled so that the phase error becomes zero.

Hence, the oscillation frequency of the free-running oscillator can be set to any desired frequency which is an integer times as high as the input signal frequency. The frequency set is made by selecting an appropriate division ratio of the frequency divider. This oscillator circuit is advantageous in that the output level and the phase relationship between the input and output signals can be set with an extremely high level of accuracy. The free-running oscillation output can be obtained from the free-running oscillator even when the input signal is interrupted.

However, the circuit construction is very complicated, as described above, resulting in a high production cost. In addition, the low pass filter requires a large time constant. Therefore, it cannot be fabricated in a semiconductor monolithic integrated circuit device.

SUMMARY OF THE INVENTION

It is, therefore, an object of the present invention to provide an oscillator circuit which produces an oscillation signal having a frequency which is an integer times as high as the frequency of an input signal, with a simple circuit construction.

It is another object of the present invention to provide an oscillation circuit which can easily set the output level and which provides a relatively high level of accuracy in setting the phase relationship between the input and output signals.

It is still another object of the present invention to provide an oscillation circuit which produces an oscillation output having a frequency which is an integer times as high as the frequency of an input signal, with less distortion.

The oscillation circuit in accordance with the present invention comprises a free-running oscillator oscillating at a predetermined frequency. A signal generator generates a trigger signal which is in synchronism with an input signal supplied thereto. The trigger signal is supplied to the free-running oscillator to make a signal level in the free-running oscillator which is equal to a reference level. The free-running oscillator delivers an output signal. The predetermined frequency of the free-running oscillator is approximately equal to a frequency which is an integer times as high as that of the input signal.

Since the free-running oscillator keeps its frequency even when no input signal is supplied, an oscillation signal having a frequency approximately equal to that which is an integer times as high as the oscillation frequency of the input signal can be obtained as the output signal. When the input signal is applied, the signal generator generates a trigger signal in synchronism with the input signal. The free-running oscillator receives the trigger signal from the signal generator. Whenever the trigger signal is applied, the oscillation signal level at the junction point of the free-run oscillator and the signal generator is locked to the reference level. The oscillation waveform at the junction point appears at the time when the trigger signal disappears. In other words, the free-running oscillator starts to oscillate in synchronism with the trigger signal. As a result, the oscillation circuit, in accordance with the present invention, generates an oscillation signal having a frequency which is substantially equal to that of an integer multiplied by the frequency of the input signal.

The oscillation circuit in accordance with the present invention is simple in a circuit construction and can be produced economically.

Since the signal level of the oscillation signal does not depend upon the input signal level and since it is substantially determined by the oscillation signal level of the free-running oscillator, a desired output signal level can be obtained easily. Since the oscillation frequency of the free-running oscillator becomes approximatel equal to that of an integer multiplied by the frequency of the input signal, the accuracy of the phase relationship between the input and output signals is considerably high. An oscillation signal having less distortion can be obtained.

The above and other objects, advantages and features of the present invention will become more apparent from the following description taken in conjunction with the accompanying drawings.

BRIEF DESCRIPTION OF THE DRAWINGS

FIG. 1 is a block diagram showing one preferred embodiment of the present invention;

FIGS. 2A through 2E are waveform diagrams (voltage waveform diagrams) at each part of the oscillation circuit shown in FIG. 1;

DETAILED DESCRIPTION OF THE PREFERRED EMBODIMENTS

Figure 3:
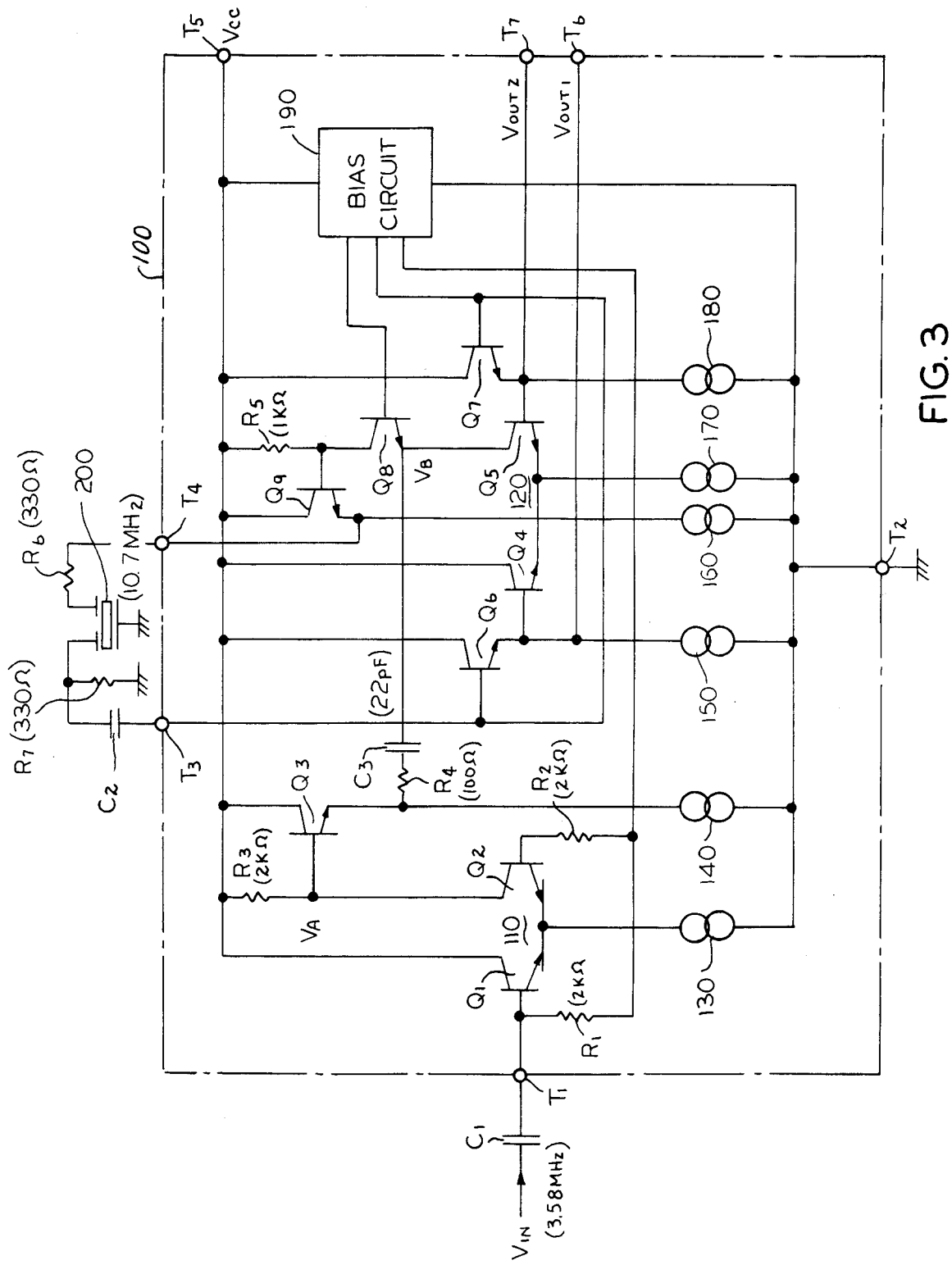
FIG. 3 is a circuit diagram showing another preferred embodiment of the present invention.

One preferred embodiment of the present invention will be explained with reference to FIG. 1. An input signal source 1 generates a signal $V_{IN}$ having a frequency $f_0$. This signal $V_{IN}$ is a sine wave as shown in FIG. 2A. If desired, the signal $V_{IN}$ may be a square wave, a trapezoidal wave or the like. The signal $V_{IN}$ from the input signal source 1 is applied to a trigger signal generator 20, through an input terminal 10.

The trigger signal generator 20 generates a trigger signal $V_T$ which is shown in FIG. 2B, in synchronism with the input signal $V_{IN}$. The trigger signal $V_T$ is generated when the signal level of the input signal $V_{IN}$ crosses the center level, to change from negative to positive. The trigger signal generator 20 may be composed of a monostable multiple vibrator. Alternatively, it may be composed of an amplifier, a differential circuit and a rectification circuit. The amplifier amplifies the sine wave input signal to convert it into a square wave signal. The differential circuit receives the square wave signal to produce a differential signal. The rectification circuit generates the trigger signal $V_T$ having a level which changes in the positive direction, as shown in FIG. 2B. Furthermore, the trigger signal $V_T$ may be generated by utilizing the input signal $V_{IN}$ and a signal obtained by delaying the input signal $V_{IN}$. Thus, the signal generator 20 generates the trigger signal $V_T$ by utilizing a circuit having a small time constant.

Therefore, the trigger signal generator 20, along with a time constant circuit, can be constructed as a monolithic integrated circuit device. The trigger signal $V_T$ compels a free-running oscillator 30 to make its oscillation signal level equal to a reference level, as described hereinafter. Accordingly, the signal width of the trigger signal $V_T$ should be less than $\frac{1}{2}$ of the period of the oscillation frequency of the free-running oscillator 30, and preferably, less than $\frac{1}{4}$ of the period. If the width of the trigger signal is wide, the distortion in the output signal would increase and the phase deviation between the input and output signals would become large.

As is well known in the art, the free-running oscillator 30 consists of an amplification section 32 and a resonant section 34 which positively feeds back the output of the amplification section to the input. This oscillator 30 oscillates at a frequency $f_1$ which is determined by the resonant characteristics of the resonant section 34. Its signal waveform is a sine wave as represented by a signal $V_{OSC}$ in FIG. 2C. The resonant section 34 comprises an L-C resonant circuit or a resonant element such as a ceramic filter. The amplification section 32 can be composed of a differential amplifier. The free-running oscillator 30 may also be composed of a C-R time constant circuit and a Schmitt trigger circuit. In this a case, the signal waveform is a square waveform.

The frequency $f_1$ of the oscillation signal $V_{OSC}$ of the free-running oscillator 30 is set to approximately twice the frequency $f_0$ of the input signal $V_{IN}$ by selecting the resonant characteristics of the resonant section 34. In other words, $f_1 = 2(f_0 + \Delta f)$. It may, of course, be $f_1 = 2(f_0 - \Delta f)$. Accordingly, as can be seen from FIGS. 2A and 2C, showing the phase relationship between the input signal $V_{IN}$ and the free-running oscillation signal $V_{OSC}$, one period of the input signal $V_{IN}$ approximately corresponds to two periods of the free-running oscillation signal $V_{OSC}$, but the relationship is not completely accurate.

The trigger signal $V_T$ from the trigger signal generator 20 is applied to the output side of the amplification section 32 in the free-running oscillator 20, that is, to the input side of the resonant section 34.

The output signal $V_{OUT}$ of the oscillation circuit shown in FIG. 1 is derived from an output terminal 40. The output terminal 40 is connected to the output side of the resonant section 34 in the free-running oscillator 30, that is, to the input side of the amplification section 32.

When no input signal $V_{IN}$ is generated from the input signal source 1, the trigger signal generator 20 does not apply the trigger signal $V_T$ to the free-running oscillator 30. Hence, the free-running oscillator 30 self-oscillates at the frequency $f_1$ which is determined by the resonant characteristics of the resonant section 34. Accordingly, the oscillation signal $V_{OSC}$ shown in FIG. 2C is generated from the output terminal 40, as an output signal.

When the input signal $V_{IN}$ is applied to the input terminal 10, the trigger signal $V_T$ is generated and is applied to the output side of the amplification section 32 in the free-running oscillator 30. As a result, the level of the output signal $V_{FB}$ of the amplification section 32 is locked to a reference level by the trigger signal $V_T$. This reference level is selected to a center level $V_{FB-C}$ (see FIG. 2D) of the output signal $V_{FB}$ of the amplification section 32.

During the period in which the trigger signal $V_T$ is applied, the output signal level of the amplification section 32 is fixed at the center level $V_{FB-C}$. When the trigger signal $V_T$ disappears, the output signal level of the amplification section 32 is changed in response to the oscillating operation of the free-running oscillator 30, due to the positive feedback loop consisting of the amplification section 32 and the resonant section 34. Consequently, the output signal $V_{FB}$ of the amplification section 32 has a waveform as represented in FIG. 2D. In other words, the output signal level that has been lower than the center level $V_{FB-C}$ is locked to the center level $V_{FB-C}$ by the trigger signal $V_T$. During the period in which the trigger signal is applied, the output signal level of the amplification section 32 is locked to the center level $V_{FB-C}$. After the trigger signal $V_T$ disappears, the output signal level becomes higher than the center level $V_{FBC}$. As a result, signals of two periods of the output signal $V_{FB}$ of the amplification section 32 are generated during one period of input signal $V_{IN}$.

The output terminal 40 is connected to the input side of the amplification section 32, but is not connected to its output side. In other words, the output signal $V_{FB}$ is generated from the output terminal of the amplification section 32 and is not applied to output terminal, but it is a signal passing through the resonant section 34 and then to output terminal 40. Due to the resonant characteristics of the resonant section 34, that is, the band pass filter characteristics, the steep or step-like level changes of the output signal $V_{FB}$ of the amplification section 32 is removed and an output signal $V_{OUT}$ having a continuous level change can be obtained from the output terminal 40. The waveform of this output signal $V_{OUT}$ is shown in FIG. 2E.

As apparent from FIG. 2E, two periods of the output signal $V_{OUT}$ correspond accurately to one period of input signal $V_{IN}$. The relationship $f_2 = 2f_0$ exists between the frequency $f_2$ of the output signal $V_{OUT}$ and the frequency $f_0$ of the input signal $V_{IN}$. There is no phase difference between them. The output signal $V_{OUT}$ is approximately a complete sine wave, although it has a slight distortion at the point of application of the trigger signal $V_T$.

The output signal $V_{OUT}$ is approximately a sine wave which can be obtained by applying the trigger signal $V_T$ to the output side of the amplification section 32 (the input side of the resonant section 34) and obtaining the output signal $V_{OUT}$ from the input side of the amplification section (the output side of the resonant section 34). However, if there is a large deviation of the oscillation frequency $f_1$ of the free-running oscillator 30 from the frequency of an integer times the input frequency $f_0$, the distortion in the output signal $V_{OUT}$ is out of the tolerance range. The relationshp $f_1 = n(f_0 \pm \Delta f_0)$ exists between the oscillation frequency $f_1$ of the free-running oscillator 30 and the frequency $f_0$ of the input signal $V_{IN}$. In the oscillation circuit shown in FIG. 1, n is 2. To obtain the output signal $V_{OUT}$ having only a small distortion, the relationship $\Delta f_0/f_0 \leq 5\%$ is preferably satisfied. In other words, the frequency $f_1$ of the free-running oscillator 30 is preferably set to satisfy the relation $n(f_0 - 0.05f_0) \leq f_1 \leq n(f_0 + 0.05f_0)$.

The oscillation frequency $f_1$ of the free-running oscillator 30 may be set to satisfy the relationship $f_1 = n \cdot f_0$. In this case, one may consider that it is unnecessary to apply the trigger signal $V_T$ which is obtained by a use of the input signal $V_{IN}$ to the free-running oscillator 30. However, it is substantially impossible to obtain the relationshp $f_1 = n \cdot f_0$ due to the change in the circuit constant of a L-C resonant circuit of a mechanical resonant element such as a ceramic filter forming the resonant section 34 or due to the variance of the circuit elements forming the amplification section 32. Therefore, the application of the trigger signal is significant to obtain an output signal having the frequency which is an integer times as high as the frequency of an input signal.

As described above, the oscillation circuit in accordance with the present invention generates the oscillation output signal $V_{OUT}$ having frequency which is an integer times as high as the frequency of the input signal $V_{IN}$ without the deterioration of the distortion characteristics in the output signal and without requiring a complicated circuit.

Another preferred embodiment of the present invention will be described with reference to FIG. 3. The oscillation circuit shown in FIG. 3 is used for supplying a video signal to a delay line in a video tape recorder. Since the delay line has band pass characteristics, the video signal should be modulated by a use of a signal from an oscillator circuit in order to supply the video signal to the delay line. The video tape recorder further has a chrominance processing circuit including a reference oscillator. For this reason, a beat frequency is generated if the frequency relationship between the oscillation frequencies of the reference oscillator and of the above oscillator circuit is not an integer multiple. Therefore, the oscillator circuit shown in FIG. 3 generates the signal for modulating the video signal. Its oscillation frequency is three times the frequency of the reference oscillator in the chrominance processing circuit.

An input signal of a sine wave having a 3.58 MHz frequency (see FIG. 4A) is derived from the reference oscillator in the chrominance processing circuit, and applied to the input terminal $T_1$ of a monolithic integrated circuit 100, through an input coupling capacitor $C_1$. The input signal $V_{IN}$ is applied through the terminal $T_1$ to the base of a transistor $Q_1$. The transistor $Q_1$ forms a differential amplifier 110, together with a transistor $Q_2$ and a constant current source 130. A base bias voltage is respectively applied to the transistors $Q_1$ and $Q_2$ via resistors $R_1$ and $R_2$ from a bias circuit 190 which is interposed between a power supply terminal $T_5$ and a ground terminal $T_2$.

The input signal $V_{IN}$ is amplified by the differential amplifier 110, and hence a square wave signal $V_A$ (shown in FIG. 4B) is generated across a load resistor $R_3$.

The square wave signal $V_A$ is applied to an emitter follower amplifier comprising a transistor $Q_3$ and a constant current source 140. Accordingly, a signal which is substantially the same as the square wave signal $V_A$ appears at the emitter of the transistor $Q_3$.

The emitter output of the transistor $Q_3$ is applied to the emitter of a transistor $Q_8$ through a resistor $R_4$ and a capacitor $C_3$ formed in the monolithic integrated circuit 100. A bias is applied to the base of the transistor $Q_8$ from the bias circuit 190. The capacitor $C_3$ forms a differential circuit along with an impedance at the emitter of the transistor $Q_8$. Accordingly, a differential signal $V_B$ (shown in FIG. 4C) is produced at the emitter of the transistor $Q_8$. The signal $V_B$ is generated in synchronism with the leading and trailing edges of the square wave signal $V_A$ and has the same polarity as the edge of the square wave signal $V_A$.

The monolithic integrated circuit 100 includes an amplification section to form a free-running oscillator. The amplification section includes a differential amplifier 120 comprising transistors $Q_4$, $Q_5$ and a constant current source 170. A base bias voltage is applied from the bias circuit 190 through an emitter follower circuit comprising a transistor $Q_6$ and a constant current source 150. The same base bias voltage is applied to the transistor $Q_5$ through an emitter follower circuit comprising of a transistor $Q_7$ and a constant current source 180. The load of the differential amplifier 120 comprises a resistor $R_5$ and a transistor $Q_8$ connected in series. The output of the differential amplifier 120, appearing across the resistor $R_5$, is applied to the terminal $T_4$ via an emitter follower circuit comprising a transistor $Q_9$ and a constant current source 160. The input of the differential amplifier 120 is supplied from the terminal $T_3$. A resonant circuit comprising a ceramic filter 200 having a 10.7 MHz bandpass filter characteristics, resistors $R_6$, $R_7$ and a capacitor $C_2$ is interposed between the terminals $T_3$ and $T_4$.

When the potential at the terminal $T_3$ increases, a current flowing through the transistor $Q_5$ is decreased, so that the voltage drop across the resistor $R_5$ becomes smaller. In other words, when the input of the differential amplifier 120 increases, its output also increases. The output signal of the frequency component passing through the ceramic filter 200 is fed back to the input of amplifier 120, through the terminal $T_3$. Thus, a positive feedback loop is formed between the input and output of the differential amplifier 120 by the resonant circuit interposed between the terminals $T_3$ and $T_4$. Consequently, the oscillator having the differential amplifier 120 and the ceramic filter 200 free-running oscillates at a 10.7 MHz frequency. This oscillation signal $V_{OSC}$ is shown in FIG. 4D. The frequency of the input signal $V_{IN}$ is 3.58 MHz. Accordingly, one period of the input signal $V_{IN}$ corresponds to approximately three periods of the free-running oscillation signal $V_{OSC}$.

The output signal of the oscillation circuit shown in FIG. 3 is obtained from the terminals $T_6$ and $T_7$. The terminal $T_6$ is connected to the emitter of the transistor $Q_6$, and $T_7$, to the emitter of the transistor $Q_7$. Accordingly, the output signal $V_{OUT1}$ from the terminal $T_6$ has a phase difference of 180° with respect to the output signal $V_{OUT2}$ from the terminal $T_7$. It is possible, of course, to take out only one of the transistor $Q_6$ and $Q_7$.

When the input signal $V_{IN}$ is not applied to the terminal $T_1$, the free-running oscillator comprising the differential amplifier 120 and the ceramic filter 200 selfoscillates at 10.7 MHz. Therefore, the oscillation signal $V_{OSC}$ shown in FIG. 4D is obtained from the output terminal $T_6$, as the output signal. An oscillation signal having a phase which is different from the signal $V_{OUT1}$ by 180° is obtained from the terminal $T_7$ as the output signal $V_{OUT2}$.

Figure 4A:
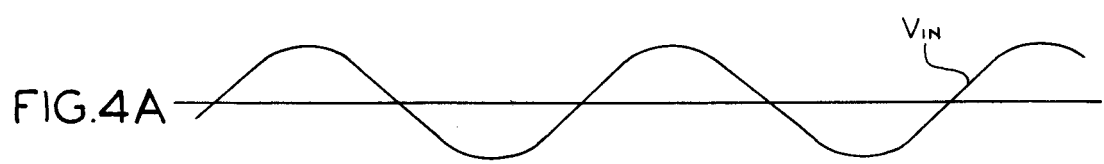
FIGS. 4A through 4F are signal waveform diagrams (voltage waveform diagrams) at each part of the oscillation circuit shown in FIG. 3.
Figure 4B:
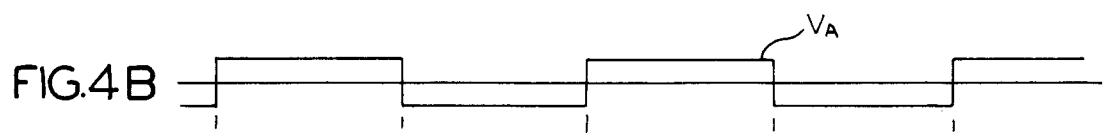
Figure 4C:
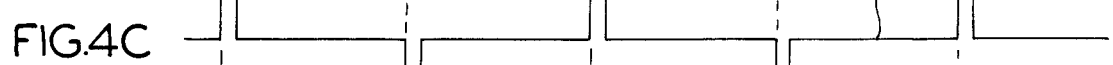
Figure 4D:
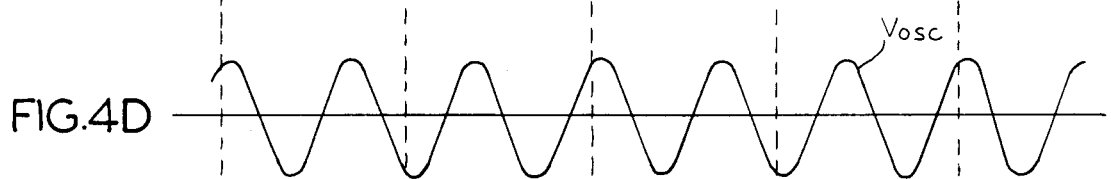

When the input signal $V_{IN}$ shown in FIG. 4A is applied to the input terminal $T_1$, the differential signal $V_B$ shown in FIG. 4C is applied to the emitter of the transistor $Q_8$. The emitter potential of the transistor $Q_8$ is increased by the differential signal $V_B$ having a level change in the upper direction. On the other hand, the base of the transistor $Q_8$ is kept constant by the bias voltage from the bias circuit 190. Accordingly, the collector voltage of the transistor $Q_8$ increases drastically, so that the transistor $Q_9$ falls into a saturated condition. As a result, the voltage at the terminal $T_4$ is locked to a voltage $V_m$ which is obtained by subtracting the collector-emitter saturation voltage $V_{CE(SAT)9}$ of the transistor $Q_9$ from the power source voltage $V_{CC}$.

Figure 4E:
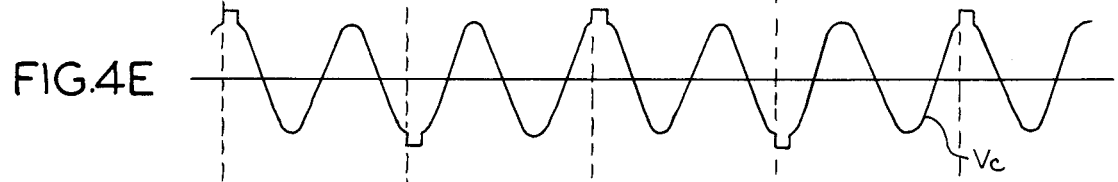

When the differential signal $V_B$ having a level change in the negative direction is applied to the emitter of the transistor $Q_8$, the bias of the transistor $Q_8$ becomes more positive. Consequently, the collector voltage of the transistor $Q_8$ drops drastically to lock the voltage at the terminal $T_4$ to the voltage $V_n$ which is obtained by subtracting the base-emitter voltage of the transistor $Q_9$ from the decreased collector voltage of the transistor $Q_8$. In other words, whenever the differential signal $V_B$ is applied, the upper signal peak value of the oscillation signal $V_{OSC}$ is locked to the voltage $V_m$ and its lower signal peak value is locked to the voltage $V_n$. According, a signal $V_C$ (shown in FIG. 4E) is generated from the terminal $T_4$.

Figure 4F:
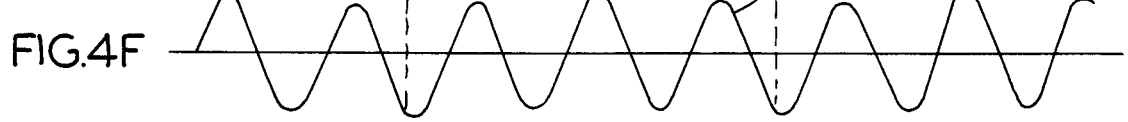

This signal $V_c$ is fed back to the terminal $T_3$ through the resonant circuit comprising the ceramic filter 200, resistors $R_6$, $R_7$ and the capacitor $C_2$. Signal $V_c$ is further applied to the input of the differential amplifier 120 through the emitter follower transistor $Q_6$ and to the output terminal $T_6$. The drastic level change in the signal $V_c$ does not appear at the output terminal $T_6$ due to the band pass filter characteristics of the resonant circuit. Accordingly, the signal $V_{OUT1}$, which is approximate to a complete sine wave as shown in FIG. 4F, can be obtained from the output terminal $T_6$. The trigger signal $V_T$ is applied so that three periods of the output signal $V_{OUT}$ accurately correspond to one period of input signal $V_{IN}$. In other words, the oscillation circuit shown in FIG. 3 oscillates at the frequency which is equal to three times the frequency of the input signal $V_{IN}$. During one period of input signal $V_{IN}$, the free-run oscillation signal is locked twice. Therefore, the accuracy of the frequency relationship between the input and output signals in this oscillation circuit is higher than the accuracy in the circuit shown in FIG. 1.

The output signal $V_{OUT2}$, obtained from the output terminal $T_7$, has a phase difference which is shifted 180° from the phase of the output signal $V_{OUT1}$ shown in FIG. 4F. Hence, its signal waveform is omitted. The output signals $V_{OUT1}$ and $V_{OUT2}$ are used to demodulate the video signal, as described hereinbefore.

In FIG. 3, the output terminals $T_6$, $T_7$ can be also used as the bias terminals for a subsequent stage (not shown); hence, it is preferable to apply the differential signal $V_B$ as the trigger signal to the emitter of the transistor $Q_8$. However, the signal may be applied to the terminal $T_3$ or the base of the transistors $Q_4$, $Q_5$, $Q_7$ or $Q_9$. A C-L resonant circuit may be used in place of the ceramic filter 200. If the input signal is a square wave, the differential amplifier 110 is not necessary. The free-running oscillator can oscillates with an approximate frequency which is higher than four times the input frequency.

As described in the foregoing, the present invention provides an oscillation circuit which generates an oscillation signal having a frequency which is an integer multiplied by the frequency of input signal, with a simplified construction and a low distortion.

The present invention is not limited to the foregoing embodiments but can be modified suitably without departing the scope and spirit thereof.

We claim:

1. An oscillator circuit comprising an input terminal supplied with an input a.c. signal having a first frequency, a signal generator coupled to said input terminal and in response to said input a.c. signal generating a trigger pulse every time said input a.c. signal crosses a reference potential, said trigger pulse being generated twice during one cycle period of said input a.c. signal, a free-running oscillator oscillating at a second frequency approximately equal to a frequency of n times (n being an integer and at least two) as high as said first frequency, means coupled between said free-running oscillator and said signal generator for supplying said trigger pulse to said free-running oscillator, and means coupled to said free-running oscillator for deriving an output signal.

2. The oscillator circuit as defined in claim 1, wherein said free-running oscillator has an amplification section and a resonant section coupled between input and output ends of said amplification section, said trigger pulses being applied to the output end of said amplification section via said supplying means, said output signal being derived from the input end of said amplification section via said deriving means.

3. The oscillator circuit as defined in claim 1, wherein a width of each trigger pulse is less than the width of a half period of said first frequency of said free-running oscillator.

4. The oscillator circuit as defined in claim 1, wherein a width of each trigger pulse is less than the width of a quarter period of said first signal of said free running oscillator.

5. The oscillator circuit as defined in claim 1 wherein said first frequency of said free-running oscillator and said second frequency of said input signal have the following relationship:

$$n(f_0-0.05f_0) \leq f_1 \leq n(f_0+0.05f_0)$$

where $f_0$ is said second frequency of said input signal and $f_1$ is said first frequency of said free-running oscillator.

6. An oscillator circuit comprising a free-running oscillator having an amplification section and a resonant section coupled between input and output ends of said amplification section to attain a positive feedback of a signal at the output end of said amplification section to the input end of said amplification section, thereby generating an oscillation signal having a first frequency, means for generating a trigger signal having a second frequency, the ratio of said first frequency to said second frequency being substantially an integer and at least two means coupled between said generating means and said free-running oscillator for supplying said trigger signal to the output end of said amplification section, and means coupled to said free-running oscillator for deriving an output signal from the input end of said amplification section.

7. An oscillation circuit comprising means for generating a train of trigger pulses an amplifier having input and output ends, a resonant circuit having first and second terminals, means for connecting said output end of said amplifier to said first terminal of said resonant circuit, a transistor coupled in an emitter follower configuration, means for connecting said second terminal of said resonant circuit ot the base of said transistor, means for connecting the emitter of said transistor to said input end of said amplifier, said amplifier cooperating with said resonant circuit to form a free-running oscillator which is oscillating at a predetermined frequency coupled to said input end of said amplifier for deriving an output signal from said input end of said amplifier, and means coupled between said generating means and said output of said amplifier for supplying said trigger pulses to said output end of said amplifier.

8. An oscillator circuit comprising an input terminal supplied with an input signal having a first frequency derived from a reference oscillator which is used for demodulating a video signal, a free-running oscillator which is oscillating at a second frequency which is approximately two or more times as high as said first frequency of said reference oscillator, said free-running oscillator having first and second transistors forming a first differential amplifier, a resistor provided in a current path through said second transistor and serving as a load of said first differential amplifier, a first emitter follower amplifier receiving a signal across said resistor, and a resonant circuit coupled between an output end of said first emitter follower amplifier and an input end of said first transistor in said first differential amplifier, a second differential amplifier for receiving said input signal, a second emitter follower amplifier for receiving an output of said second differential amplifier, a third transistor having an emitter-collector path coupled between said resistor and said second transistor, a capacitor coupled between an output end of said second emitter follower amplifier and the emitter of said third transistor, and an output terminal coupled to said first differential amplifier.

9. A oscillator comprising an input terminal for receiving an input signal having a first frequency, a first and a second transistor connected in a differential amplifier form, means for supplying said input signal to one of said first and second transistors, a first load connected to the collector of said second transistor, a third transistor having a base connected to the connection point of said first load and the collector of said second transistor, a fourth and a fifth transistor connected in a differential amplifier form, a sixth transistor having an emitter connected to the collector of said fifth transistor, a second load connected to the collector of said sixth transistor, a seventh transistor having a base connected to the connection point of said second load and the collector of said sixth transistor, a resonant circuit having a first terminal connected to the emitter of said seventh transistor and a second terminal, an eighth transistor having a base connected to said second terminal of said resonant circuit and an emitter connected to the base of said fourth transistor, a capacitor connected between the emitters of said third and said sixth transistors to supply to said sixth transistor a differential signal relative to said input signal, and an output terminal connected to one of the bases of said fifth and said sixth transistors to deliver an output signal which is synchronized to said differential signal and which has a second frequency that is substantially equal to n times (n being an integer and at least two) as high as said frequency.

* * * * *